(12) United States Patent
Niu et al.

(10) Patent No.: US 7,094,713 B1
(45) Date of Patent: Aug. 22, 2006

(54) METHODS FOR IMPROVING THE CRACKING RESISTANCE OF LOW-K DIELECTRIC MATERIALS

(75) Inventors: Dong Niu, Tualatin, OR (US); Haiying Fu, West Linn, OR (US); Brian Lu, Fremont, CA (US); Feng Wang, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 3 days.

(21) Appl. No.: 10/860,340

(22) Filed: Jun. 2, 2004

Related U.S. Application Data

(63) Continuation-in-part of application No. 10/807,680, filed on Mar. 23, 2004, which is a continuation-in-part of application No. 10/800,377, filed on Mar. 11, 2004.

(51) Int. Cl.
H01L 21/26 (2006.01)
(52) U.S. Cl. .................. 438/795; 438/410
(58) Field of Classification Search ........ 438/795–798, 438/960–961, 780–781, 707–710
See application file for complete search history.

(56) References Cited

U.S. PATENT DOCUMENTS

| | | |
|---|---|---|
| 4,357,451 A | 11/1982 | McDaniel |
| 4,882,008 A | 11/1989 | Garza et al. |
| 4,885,262 A | 12/1989 | Ting et al. |
| 5,504,042 A | 4/1996 | Cho et al. |
| 5,686,054 A | 11/1997 | Barthel et al. |
| 5,700,844 A | 12/1997 | Hedrick et al. |
| 5,789,027 A | 8/1998 | Watkins et al. |
| 5,851,715 A | 12/1998 | Barthel et al. |
| 5,858,457 A | 1/1999 | Brinker et al. |
| 5,920,790 A | 7/1999 | Wetzel et al. |
| 6,140,252 A | 10/2000 | Cho et al. |
| 6,177,329 B1 | 1/2001 | Pang |
| 6,268,276 B1 | 7/2001 | Chan et al. |
| 6,270,846 B1 | 8/2001 | Brinker et al. |
| 6,271,273 B1 | 8/2001 | You et al. |
| 6,312,793 B1 | 11/2001 | Grill et al. |
| 6,329,017 B1 | 12/2001 | Liu et al. |
| 6,329,062 B1 | 12/2001 | Gaynor |
| 6,340,628 B1 | 1/2002 | Van Cleemput et al. |
| 6,365,266 B1 | 4/2002 | MacDougall et al. |

(Continued)

FOREIGN PATENT DOCUMENTS

WO  WO95/07543  3/1995

OTHER PUBLICATIONS

U.S. Appl. No. 10/820,525, filed Apr. 7, 2004 by Wu et al., titled "Methods for Producing Low-k CDO Films with Low Residual Stress."

(Continued)

*Primary Examiner*—David Nelms
*Assistant Examiner*—Calvin Lee
(74) *Attorney, Agent, or Firm*—Beyer Weaver & Thomas, LLP.

(57) ABSTRACT

Methods for improving the mechanical properties of a CDO film are provided. The methods involve, for instance, providing either a dense CDO film or a porous CDO film in which the porogen has been removed followed by curing the CDO film at an elevated temperature using either a UV light treatment, an e-beam treatment, or a plasma treatment such that the curing improves the mechanical toughness of the CDO dielectric film.

12 Claims, 6 Drawing Sheets

U.S. PATENT DOCUMENTS

| | | | |
|---|---|---|---|
| 6,383,466 | B1 | 5/2002 | Domansky et al. |
| 6,383,955 | B1 | 5/2002 | Matsuki et al. |
| 6,386,466 | B1 | 5/2002 | Ozawa et al. |
| 6,387,453 | B1 | 5/2002 | Brinker et al. |
| 6,391,932 | B1 | 5/2002 | Gore et al. |
| 6,392,017 | B1 | 5/2002 | Chandrashekar |
| 6,420,441 | B1 | 7/2002 | Allen et al. |
| 6,444,715 | B1 | 9/2002 | Mukherjee et al. |
| 6,479,374 | B1 | 11/2002 | Ioka et al. |
| 6,500,770 | B1 | 12/2002 | Cheng et al. |
| 6,548,113 | B1 | 4/2003 | Birnbaum et al. |
| 6,576,345 | B1 | 6/2003 | Cleemput et al. |
| 6,596,467 | B1 | 7/2003 | Gallagher et al. |
| 6,596,654 | B1 | 7/2003 | Bayman et al. |
| 6,667,147 | B1 | 12/2003 | Gallagher et al. |
| 6,677,251 | B1 * | 1/2004 | Lu et al. ............... 438/778 |
| 6,756,085 | B1 * | 6/2004 | Waldfried et al. ........ 427/515 |
| 6,805,801 | B1 | 10/2004 | Humayun et al. |
| 6,812,043 | B1 * | 11/2004 | Bao et al. .................. 438/4 |
| 6,831,284 | B1 * | 12/2004 | Demos et al. ........... 250/492.3 |
| 6,848,458 | B1 | 2/2005 | Shrinivasan et al. |
| 2002/0001973 | A1 | 1/2002 | Wu et al. |
| 2002/0034626 | A1 | 3/2002 | Liu et al. |
| 2002/0106500 | A1 * | 8/2002 | Albano et al. ........... 428/304.4 |
| 2002/0123240 | A1 | 9/2002 | Gallagher et al. |
| 2002/0192980 | A1 | 12/2002 | Hogle et al. |
| 2003/0064607 | A1 * | 4/2003 | Leu et al. ................. 438/780 |
| 2003/0119307 | A1 | 6/2003 | Bekiaris et al. |
| 2003/0157248 | A1 | 8/2003 | Watkins et al. |
| 2004/0069410 | A1 * | 4/2004 | Moghadam et al. ... 156/345.32 |
| 2004/0096672 | A1 | 5/2004 | Lukas et al. |
| 2004/0099952 | A1 | 5/2004 | Goodner et al. |
| 2004/0102031 | A1 | 5/2004 | Kloster et al. |
| 2004/0185679 | A1 | 9/2004 | Ott et al. |

OTHER PUBLICATIONS

Cho et al., "Plasma Treatments of Molecularly Templated Nanoporous Silica Films," Electrochemical and Solid-State Letters, 4 (4) G35-G38 (2001).

Yung et al., "Spin-on Mesoporous Silica Films with Ultralow Dielectric Constants, Ordered Pore Strucutres, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Justin F. Gaynor, "In-Situ Treatment of Low-K Films With a Silylating Agent After Exposure To Oxidizing Environments," U.S. Appl. No. 10/056,926 filed Jan. 24, 2002, 34 Pages.

Humayun et al., "Method for Forming Porous Films By Porogen Removal Combined Wtih In SITU Surface Modification", Novellus Corporation, Appl. No. 10/404,693, filed Mar. 31, 2003, pp. 1-32.

Tipton et al., "Method Of Porogen Removal From Porous Low-K Films Using UV Radiation", Novellus Systems, Inc., U.S. Appl. No. 10/672,311, filed Sep. 26, 2003, pp. 1-27.

Jan, C.H., et al, 90NM Generation, 300mm Wafer Low k ILD/Cu Interconnect Technology, 2003 IEEE Interconnect Technology Conference.

Wu et al., U.S. Appl. No. 10/789,103, entitled: Methods For Producing Low-K CDO Films With Low Residual Stress.

Wu et al., U.S. Appl. No. 10/800,409, entitled: Methods For Producing Low-K CDO Films.

Gopinath et al., U.S. Appl. No. 10/016,017, File Date: Dec. 12, 2001, entitled: Method and Apparatus for Introduction of Solid Precursors and Reactants into a Supercritical Fluid Reactor.

Reinhardt et al., U.S. Appl. No. 10/125,614, File Date: Apr. 18, 2002, entitled: Supercritical Solutions for Cleaning Wafers.

Joyce et al., U.S. Appl. No. 10/202,987, File Date: Jul. 23, 2002, entitled: Supercritical Solutions for Cleaning Photoresist and Post-Etch Residue from Low-K Materials.

Tipton et al., "Methods for Removal of Porogens From Porous Low-K Films Using Supercritical Fluids", Novellus Systems, Inc., Appl. No. 10/672,305, filed Sep. 26, 2003, pp. 1-32.

Gangpadhyay et al., "The First International Surface Cleaning Workshop," Northeastern University, Nov. 11-14, 2002.

Cho et al., "Method and Apparatus for UV Exposure of Low Dielectric Constant Materials for Porogen Removal and Improved Mechanical Properties", Novellus Systems, Inc., Appl. No. 10/800,377, filed Mar. 11, 2004, pp. 1-31.

Wu et al., "Method and Apparatus of UV Exposure of Low Dielectric Constant Materials for Porogen Removal and Improved Mechanical Properties", Novellus Systems, Inc., Appl. No. 10/807,680, filed Mar. 23, 2004, pp. 1-34.

Humayun et al., "Method For Forming Porous Films By Porogen Removal Combined With In Situ Modification", U.S. Appl. No. 10/404,693, filed Mar. 31, 2003, Office Action dated Mar. 15, 2005.

Tipton et al., "Method Of Porogen Removal From Porous Low-K Films Using UV Radiation", U.S. Appl. No. 10/672,311, filed Sep. 26, 2003, Office Action dated Sep. 7, 2004.

Tipton et al., "Method Of Porogen Removal From Porous Low-K Films Using UV Radiation", U.S. Appl. No. 10/672,311, filed Sep. 26, 2003, Office Action dated Dec. 28, 2004.

Tipton et al., "Method For Removal Of Porogens From Porous Low-K Films Using Supercritical Fluids", U.S. Appl. No. 10/672,305, Office Action dated Mar. 22, 2005.

Bandyopadhyay et al., "Method to Improve Machenical Strength of Low-K Dielectric Film Using Modulated UV Exposure", U.S. Appl. No. 10/825,888, filed Apr. 16, 2004.

R.D. Miller et al., "Phase-Separated Inorganic-Organic Hybrids for Microelectronic Applications," MRS Bulletin, Oct. 1997, pp. 44-48.

Jin et al., "Nanoporous Silica as an Ultralow-k Dielectric," MRS Bulletin, Oct. 1997, pp. 39-42.

Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569-572.

Asoh et al., "Conditions for Fabrication of Ideally Ordered Anodic Porous Alumina Using Pretextured AI," Journal of the Electrochemica Society, 148 (4) B152-B156 (2001) pp. B152-B156.

Holland et al., "Nonlithographic Technique for the Production of Large Area High Density Gridded Field Sources," J. Vac. Sci. Technol. B 17(2), Mar./Apr. 1999, pp. 580-582.

Masuda et al. "Highly Ordered Nanochannel-Array Architecture in Anodic Alumina," App. Phys. Lett. 71(19), Nov. 1997, pp. 2770-2772.

Clube et al., White Paper from Holotronic Technologies SA; downloaded from www.holtronic.com/whitepaper/fine-patt.pdf on Mar. 12, 2002.

Meli et al., "Self-Assembled Masks for the Transfer of Nanometer-Scale Patterns into Surfaces: Characterization by AFM and LFM", Nano Letters, vol. 2, No. 2, 2002, 131-135.

"Shipley Claims Porous Low K Dielectric Breakthrough," Press Release Mar. 17, 2003.

Jeffrey M. Calvert and Michael K. Gallagher, Semiconductor International, 26 (12), 56 (2003).

Van Bavel et al., Future Fab International, 16, (2004).

Caluwaerts et al, "Post Patterning Meso Porosity Creation: A Potential Solution For Pore Sealing," IITC 2003.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Varadarajan, et al., "Strained Transistor Architecture and Method", Novellus Systems, Inc., U.S. Appl. No. 10/923,259, filed Aug. 20, 2004, pp. 1-24.

Varadarajan et al., "Tensile Dielectric Films Using UV Curing", U.S. Appl. No. 10/972,084, filed Oct. 22, 2004.

Fox et al., "Method for Improving Mechanical Properties of Low Dielectric Constant Materials", U.S. Appl. No. 10/849,568, filed May 18, 2004.

Fox et al., "Methods For Producing Low-Stress Carbon-Doped Oxide Films With Improved Integration Properties", U.S. Appl. No. 10/987,208, filed Nov. 12, 2004.

Wang et al., "Plasma Detemplating and Silanol Capping Of Porous Dielectric Films", U.S. Appl. No. 10/785,235, filed Feb. 23, 2004.

Van Den Hoek et al., "VLSI Fabrication Processes For Introducing Pores Into Dielectric Materials," U.S. Appl. No. 11/050,621, filed Jan. 31, 2005.

Draeger et al., "Creation Of Porosity In Low-K Films By Photo-Disassociation Of Imbedded Nanoparticles," U.S. Appl. No. 11/146,456, filed Jun. 6, 2005.

Wu et al., "Methods For Producing Low Stress Porous Low-K Dielectric Materials Using Precursors With Organic Functional Groups", U.S. Appl. No. 10/927,777, filed Aug. 27, 2004.

Wu et al., "Methods For Improving Integration Performance Of Low Stress CDO Films", U.S. Appl. No. 10/941,502, filed Sep. 14, 2004.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S. Office Action mailed Jul. 13, 2005, from U.S. Appl. No. 10/672,311.

U.S. Office Action mailed Jul. 27, 2005, from U.S. Appl. No. 10/785,235.

Tipton et al., "Method For Removal Of Porogens From Porous Low-K Films Using Supercritical Fluids", U.S. Patent No. 10/672,305, Office Action dated Sep. 1, 2005.

Humayun et al., "Method For Forming Porous Films By Porogen Removal Combined With In Situ Modification", U.S. Appl. No. 10/404,693, filed Mar. 31, 2003, Office Action dated Aug. 24, 2005.

U.S. Office Action mailed Jul. 13, 2005, from U.S. Appl. No. 10/672,311.

U.S. Office Action mailed Jul. 27, 2005, from U.S. Appl. No. 10/785,235.

Cho et al., "Method for Porogen Removal and Mechanical Strength Enhancement of Low-K Carbon Doped Silicon Oxide Using Low Thermal Budget Microwave Curing", U.S. Appl. No. 11/280,113, filed Nov. 15, 2005.

* cited by examiner

METHODS FOR IMPROVING THE CRACKING RESISTANCE OF LOW-K DIELECTRIC MATERIALS

CROSS-REFERENCE TO RELATED APPLICATIONS

This application is a continuation-in-part claiming priority under 35 USC 120 from U.S. patent application Ser. No. 10/807,680, filed on Mar. 23, 2004, titled "Methods of Porogen Removal for Porous Low Dielectric Constant Films Using Plasma Treatments," by Wu et al., which is in turn, a continuation-in-part of U.S. patent application Ser. No. 10/800,377, filed on Mar. 11, 2004, titled "Method and Apparatus for UV Exposure of Low Dielectric Constant Materials for Porogen Removal and Improved Mechanical Properties," by Srinivasan et al. Both applications are incorporated herein by reference in their entireties and for all purposes.

FIELD OF THE INVENTION

This invention relates to methods for preparing dielectric films having low dielectric constants and high mechanical strength. More specifically, the invention relates to methods of curing CDO films in order to improve their mechanical toughness as measured by, for example, their resistance to cracking and to crack propagation.

BACKGROUND OF THE INVENTION

There is a general need for materials with low dielectric constants (low-k values) for use in the integrated circuits (ICs). Using low-k materials as the interlayer dielectric reduces the delay in signal propagation and signal crosstalk due to capacitive effects. The lower the dielectric constant of the dielectric layer, the lower the capacitance and the lower the RC delay in the lines and signal crosstalk between electrical lines of the IC. Further, the use of low-k materials as interlayer dielectric will reduce power consumption of complex integrated circuits.

Low-k dielectrics are conventionally defined as those materials that have a dielectric constant (k) lower than that of silicon dioxide (SiO2), that is k<~4. For most current applications in the IC industry, they should have a dielectric constant of 3 or less. Typical methods of obtaining low-k materials include introducing pores into the dielectric matrix and/or doping silicon dioxide with various hydrocarbons or fluorine. In technology nodes of 90 nanometers and beyond, carbon doped oxide dielectric materials look extremely promising. However, wide spread deployment of these materials in modern integrated circuit fabrication processes presents some technological hurdles.

Specifically, in comparison with silicon dioxide, low-k carbon-doped oxide (CDO) materials typically have inferior mechanical properties due to the presence of ending methyl groups (—CH3), which are incorporated in the film in order to lower the k value of CDO materials. These mechanical properties include hardness, modulus, film residual stress, blanket film cracking threshold or limit, fracture toughness, etc. These properties are dependent primarily on the strength of the atomic bonds and their binding energies. CDO materials with inferior mechanical properties will tend to have adhesive failures (delamination) and cohesive failures (cracking) during the copper-low k integration and packaging steps. These failures are exacerbated by the increasing complexity of integrated circuits and frequently manifest with growing numbers of metallization layers. It is not uncommon for a modern IC design to require nine metallization layers, each with a separate dielectric layer. Each of these dielectric layers will have to withstand mechanical stresses from, for example, Chemical Mechanical Polishing (CMP) and/or thermal and mechanical stresses incurred during IC packaging operations.

There are a variety of methods used to improve the hardness and/or reduce the residual stress of CDO films. Examples include UV treatment and plasma treatments, etc. Some examples are presented in U.S. patent application Ser. No. 10/820,525, filed Apr. 7, 2004 by Wu, et al. and titled "Methods for Producing Low-k CDO Films with Low Residual Stress" and Van Cleemput et al., U.S. Pat. No. 6,340,628, which are both incorporated by reference herein. However, film hardness is not the only measure used to determine whether a film is acceptable for use in chip integration. It has been found that film toughness, cracking resistance, and resistance to crack propagation once a crack is formed are also important in order to ensure successful integration. Thus, there is a fundamental need for methods to improve the film toughness and cracking resistance of CDO films.

SUMMARY

To achieve the foregoing, and in accordance with the purpose of the present invention, methods for improving the mechanical properties of a CDO film are disclosed.

According to one embodiment of the invention, a CDO film is cured using an ultraviolet (UV) treatment, an e-beam treatment, or a plasma treatment. The CDO film may be either dense or porous, depending on the application.

In one implementation using a UV treatment, a CDO film is placed in a deposition chamber and exposed to an inert gas, such as helium and argon, or its mixture with some reactive gas such as hydrogen ($H_2$), acetylene ($C_2H_2$), oxygen ($O_2$), carbon dioxide ($CO_2$), and ozone at a pressure of between about 0.1 and 760 Torr. The UV curing is then performed at, for example, a wavelength of between about 210 to 410 nm, and an intensity of between about 200 mW/cm$^2$ and 1 W/cm$^2$ for between about 0.1 to 20 minutes. During curing, the substrate is maintained at, for example, a temperature of between about 150–400° C. As will be recognized by one skilled in the art other temperatures, wavelengths and intensities may be used to achieve similar effects.

According to a second embodiment of the present invention, a CDO film is cured using an e-beam treatment. The e-beam used has a dosage of, for example, 0.02 to 3 milli Coulomb (mC) per cm$^2$ with energy of about 1–50 keV. Process variables, such as temperature of treatment, and duration of treatment, according to this second embodiment of the invention are similar to that used during UV curing. However, a reactive gas is not necessary according to this embodiment.

According to a third embodiment of the present invention, a CDO film is cured using a plasma. This plasma is preferentially generated using hydrogen gas at a pressure of between about 0.5 and 20 Torr. The plasma intensity is, for example, between about 0.1 and 10 W/cm$^2$. Once again, process variables, such as temperature of treatment, and duration of treatment, according to this second embodiment of the invention are similar to that used during UV curing.

Regardless of which of the above implementations is used, films produced according to these methods will preferentially have a dielectric constant of between about 2.0–3.5.

DETAILED DESCRIPTION OF A PREFERRED EMBODIMENT

Introduction

Figure 1A:
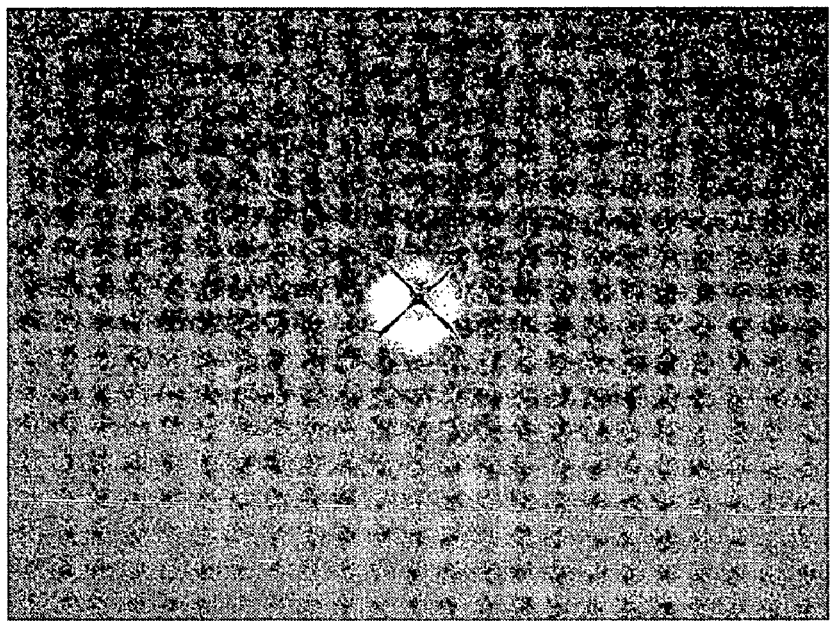
FIGS. 1A and 1B are photographs of film indentation, cracking, and branching for a film with k=2.7 and a thickness of 2.2 µm.

Methods of the invention increase the mechanical properties, and particularly the "fracture toughness," of low-k dielectric layers. In many embodiments, the methods involve depositing a dielectric layer on a substrate (e.g., a partially fabricated integrated circuit) and then curing the dielectric layer to improve its toughness.

Generally, mechanical strength may be manifest in terms of hardness, modulus, intrinsic stress, cohesive strength, etc. Intrinsic stress, hardness and modulus are well defined within the art and will not be discussed in detail herein. Measures of film hardness presented herein may be made with any suitable apparatus including a nano-indenter device. Measure of intrinsic film stress may be made with any suitable apparatus including a stress gauge or a KLA "Flexus" tool purchased from KLA-Tencor Corporation.

The mechanical strength of a material has historically been characterized in terms of the material's hardness or modulus. Recent work has indicated that, for IC integration applications, the fracture toughness or cracking behavior of a material is at least equally as important. It has also been found that two materials which are at least with the same hardness or modulus could have dramatically different cracking behaviors. Thus, a film's cracking behavior is not solely determined by the film hardness or modulus. Other properties of a material such as the nature of its chemical bonds and other intrinsic materials properties may be better indicators of a dielectric film's toughness. By engineering the bonding characteristics of a film, one may be able to slow or minimize the cracking propagation throughout the material.

A material with improved toughness will have a lower susceptibility to cracking during integration into a metalization layer such as a damascene structure. The cracking resistance will also help to improve device reliability, e.g. electro-migration (EM) performance of the integrated stack by resisting copper intrusion through the film.

While there are many ways to quantify toughness, for the purposes of this invention, toughness is measured by the CDO film's resistance to cracking and crack propagation. One way to characterize toughness in a dielectric layer is via a "cracking threshold" measurement. This is a measure of thickness of a dielectric film on a blank substrate (e.g., a flat 200 or 300 mm wafer) that can be deposited without forming a crack. In a typical experiment, the dielectric is deposited to various thicknesses using a single set of process conditions. The resulting wafer (with dielectric layer) is set aside without disturbance for a period of time (e.g., one day) and then examined for cracks. The greatest thickness at which no crack is observed is the cracking threshold. For many processes, the cracking threshold is measured in micrometers.

Note however, that cracking threshold is a static measurement. Crack propagation resistance is a more realistic measure of toughness for CDO films at thicknesses one is likely to see in semiconductor manufacturing. Of greatest interest is the rate at which cracks propagate once formed. It is clear that a film layer where cracks do not form is superior to a film layer where cracks do form but it is also clear that a film layer where cracks propagate slowly is superior to one in which the cracks propagate rapidly.

The cracking behavior of the film can be studied by first indenting the film in a controlled fashion and then observing the crack propagation in a controlled environment. A typical microscopic picture of the indentation and film cracking is shown in FIG. 1A.

Figure 1B:
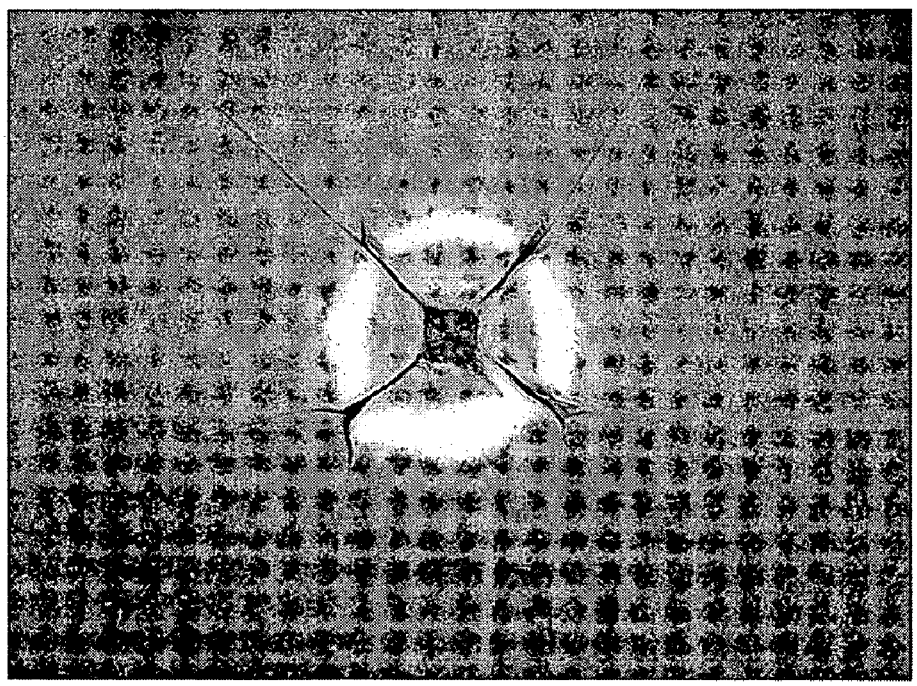

The cracking propagation velocity can then be measured by observing crack growth vs. time. The cracking velocity depends on the film cracking resistance and also on the thickness of the film. As the film cracking resistance improves, crack propagation velocity slows down. The cracking of the film can be accelerated if the film is subject to different environments, such as increased humidity or immersion in aqueous solutions. The cracking propagation velocity will increase and the number of crack branches will increase as well. A typical microscopic picture of this branching phenomenon is shown in FIG. 1B. The branches can be seen as the cracks radiate from the center of the picture.

Based on the length of the cracks formed, the number of crack branches, and the speed at which the cracks travel, it is possible to quantify whether a film has good cracking resistance (i.e., high toughness).

In one embodiment of the invention, material properties are improved such that crack propagation speed is reduced to less than about 10 Å/sec (more preferably less than about 0.1 Å/sec) in ambient cleanroom environment, while crack branching is reduced to less than 2 (more preferably no branching at all).

The films described above are typically dense CDO films, but it is noted that dielectric layers can be either dense or porous, with each type having its own advantages.

Porous dielectric layers have exceptionally low dielectric constants due to the incorporation of voids into the structure itself. However, porous dielectric materials often have very poor mechanical strength. Dense dielectric materials, on the other hand, typically have higher dielectric constants but significantly better mechanical strength.

Porous dielectric materials are typically created using porogens. Generally, a porogen is any removable material that defines void regions in a dielectric matrix. Frequently, though not necessarily, the porogen is an organic material. Methods to remove porogen from the precursor film include use of a plasma (e.g., hydrogen plasma), UV mediated methods and thermal methods. Any suitable plasma that can directly or indirectly cause the breakdown of chemical bonds in the porogen may be used. Reducing or oxidizing gases may be used, although reducing gases are preferred. Suitable gases include hydrogen, $NH_3$, $CO_2$ and $O_2$.

Many different chemical compositions may be used as the dielectric matrix, whether porous or dense. In some embodiments, the composition includes silicon and oxygen. Sometimes it also includes carbon (as in carbon doped oxides (CDOs), also referred to as organo-silica glasses (OSGs)) and/or other elements (e.g., fluorine) and even metals (e.g., germanium).

Examples of precursors for dielectric materials include silanes, alkylsilanes (e.g., trimethylsilane, di-tert-butylsilane and tetramethylsilane), alkoxysilanes (e.g., methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes and cyclic siloxanes (e.g. octamethylcyclotetrasiloxane (OMCTS) and tetramethylcyclotetrasiloxane (TMCTS)).

While the present invention may be used with conventional dielectric materials, it is by no means limited to them. Other dielectric materials such as CDO films containing unsaturated carbon—carbon bonds (i.e., double and triple bonds) may also be used. See U.S. patent application Ser. No. 10/789,103, filed on Feb. 27, 2004 by Wu, et al., and titled "Methods for Producing Low-K CDO Films with Low Residual Stress" which is incorporated in its entirety by reference herein for all purposes. Unlike films that incorporate ending methyl groups, films that incorporate unsaturated bonds have improved mechanical properties, specifically high mechanical strength and low intrinsic stress.

The advantages gained by introducing these unsaturated groups can be understood as follows. There are four major structural configurations for carbon in CDO films. The sp3 structure has the most degrees of freedom while the other three bonding structures (the sp2 structure and two sp structures) have fewer degrees of freedom and thus have more rigidity. Due to the reactive nature of deposition process and carbon—carbon triple bonds, not only triple bonds themselves but also their derivative forms will be present in CDO films. These derivative forms result from the opening of one or two of the triple bonds to form carbon—carbon double bonds or carbon—carbon bond, and/or crosslinking to Si—O—Si network. The sp2 and sp structures comprise C═C or C≡C bonds and have significantly different atom—atom of distance than do C—C, C—O, Si—O, or Si—C bonds. The nominal bond length of a C—C bond is ~1.5 Å, that of a C═C bond is ~1.3 Å and that of C≡C bond is ~1.2 Å. The bond length of a C—O bond is ~1.1 Å while the nominal bond length of a Si—O bond is ~1.6 Å and that of a Si—C bond is ~1.9 Å. Because of their rigidity and bond lengths, the C═C or C≡C bonds and their derivative forms provide a means to alter the Si—O—Si matrix structure and to engineer the lattice structure of CDO films in order to minimize the lattice mismatch between the CDO film and the substrate and thus lower the tensile stress commonly associated with the CDO film.

If the CDO film is to include carbon—carbon triple bonds or double bonds (or derivative forms of these), a precursor then preferably includes at least one carbon—carbon triple bond or double bond. Examples of suitable precursors can be found in U.S. patent application Ser. No. 10/789,103, referenced above. Precursors having carbon—carbon triple bonds or double bonds may be found in various classes of compounds including, for example, silanes having at least one hydrocarbon group with a carbon—carbon double bond and at least one alkyl group or at least one oxy-hydrocarbon group, silanes having at least one hydrocarbon group with a carbon—carbon triple bond and at least one alkyl group or at least one oxy-hydrocarbon group, bis(alkylsilyl) acetylenes, bis(alkylsilyl) ethylenes, and siloxanes having pendant hydrocarbon groups with a carbon—carbon triple bond or double bond.

The functional groups in these precursors are C═C (double bonds) and C≡C (triple bonds) which may be pendant or embedded within other functionalities. Preferably, the desired functional group in the precursor(s) is the C≡C (triple bond). During deposition, these special functional groups become integrated in the CDO film on the substrate. Rigid C≡C and/or C═C bonds, and their derivative bonding structures through crosslinking with Si, O, and C, when embedded in the CDO film, strengthen the material matrix and alter Si—O—Si backbone structure of CDO films, resulting in a more rigid lattice, thus lowering the tensile stress of the CDO film.

The thickness of the dielectric film depends upon the ultimate application. As an example, the thickness may range between about 50 to 1500 angstroms for a hard mask application. For an interlayer dielectric or packaging application, the thickness may range from 1500 angstroms up to about 2 to 3 microns (typically 2000 to 5000 Angstoms). In some cases, extra thickness is required to provide some amount of sacrificial dielectric to accommodate a subsequent planarization or polishing step. In some cases, the thickness of the precursor layer may be driven in part by the ability of the plasma, e-beam and/or UV radiation to penetrate the film during the curing operation. In these cases, the sequence of film deposition followed by curing may be repeated several times to achieve the desired final thickness.

Process

Various deposition techniques may be employed to form the CDO dielectric materials of this invention. These include various other forms of chemical vapor deposition (CVD) including plasma enhanced CVD (PECVD) and high-density plasma CVD (HDP CVD). HDP CVD of dielectric materials is described in various sources including U.S. patent application Ser. No. 09/996,619, filed Nov. 28, 2001 by Atiye Bayman et al. and titled "Gap Fill for High Aspect Ratio Structures", which is incorporated herein by reference for all purposes. Additionally, other techniques such as spin selected techniques and deposition from supercritical solutions may be employed. But for many applications of this invention, a plasma based CVD process is employed.

Figure 2:
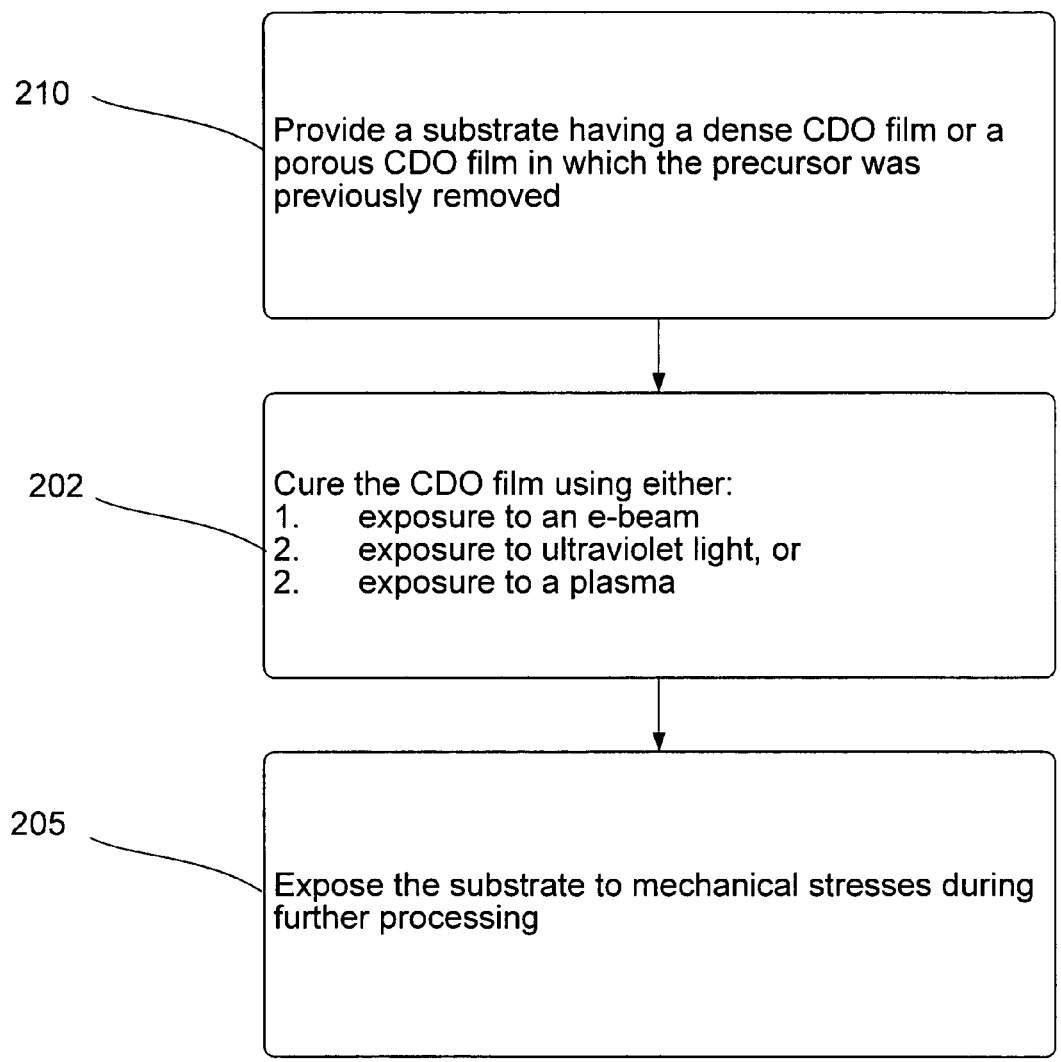
FIG. 2 is a flowchart illustrating the basic method for creating low-k CDO dielectric layers with high cracking resistance.

In one embodiment, as shown in FIG. 2, a CDO film having improved mechanical properties is formed by first performing a step 201, which provides a substrate having a dense CDO film or a porous CDO film in which the porogen was previously removed. This step is followed by a step 203, in which the CDO film is "cured" using either exposure to an e-beam, exposure to ultraviolet light, exposure to thermal energy, exposure to a plasma, or any combination of these mentioned methods. This step improves the mechanical toughness of the CDO film. Next, in a step 205, the substrate is exposed to external mechanical stresses during further processing. The tough CDO film is resistant to crack propagation such that a crack will propagate much more slowly than it would without the curing.

As noted above, curing step 203 may utilize any one of at least three different curing processes. When an e-beam treatment is used, the substrate is preferably heated to a temperature of about 20–400° C., more preferably between about 150–400° C. A conventional e-beam apparatus may be used (e.g., an active cathode that emits electrons, a cathode, and a large enough voltage difference between the two for electrons to travel freely in a vacuum or very low pressure environment.) The e-beam is set such that the energy of the electrons striking the film is approximately about 1–50 KeV. The e-beam dosage is about 0.02 mC/cm$^2$ to 3 mC/cm$^2$. Treatment continues for between about 10 seconds to about 1 hour, more preferably between about 10–8 minutes.

Curing step 203 may be also performed using UV light. Before and during UV light curing, the CDO film is exposed to an inert gas such as Ar, He, or a reactive gas such as hydrogen, acetylene, oxygen, carbon dioxide, and ozone. The reactive gas is supplied such that the deposition chamber is maintained at a pressure of between about 0.1 and 760 Torr. UV light is supplied at a wavelength of about 200–400 nm, more preferably between about 210–410 nm, and an intensity of between about 50 mW/cm2 and 3 W/cm2, more preferably between about 0.1 and 1 mW/cm$^2$. In some cases, the UV radiation is modulated at a frequency of between about 1 Hz and 1 kHz. Temperature ranges and curing treatment times are the same as for e-beam treatment.

In yet another option, curing step 203 may utilize a hydrogen plasma. The intensity of the plasma is kept between about 1000–3000 W for six 200 mm wafers (i.e., between about 0.5 and 1.5 W/cm$^2$). The chamber pressure is kept between 0.1 Torr to 20 Torr during the plasma treatment. Generally, the excited hydrogen ions in a hydrogen plasma emit a small amount of UV light which, as noted above, has independent value in curing the CDO film. Temperature ranges and curing treatment times are the same as for e-beam treatment.

Apparatus

The present invention can be implemented in many different types of apparatus. In preferred embodiments, the apparatus will include one or more chambers that house one or more substrates (e.g., semiconductor wafers) and are suitable for processing. At least one chamber will include components necessary for curing. In some embodiments, particularly those employing plasma curing, a single chamber may be employed for all operations.

Each chamber may house one or more wafers for processing. The one or more chambers maintain the wafer in a defined position or positions (with or without motion within that position, e.g., rotation, vibration, or other agitation) during procedures of the invention. For operations in which the wafer is to be heated, the apparatus may include a heating plate.

Figure 3:
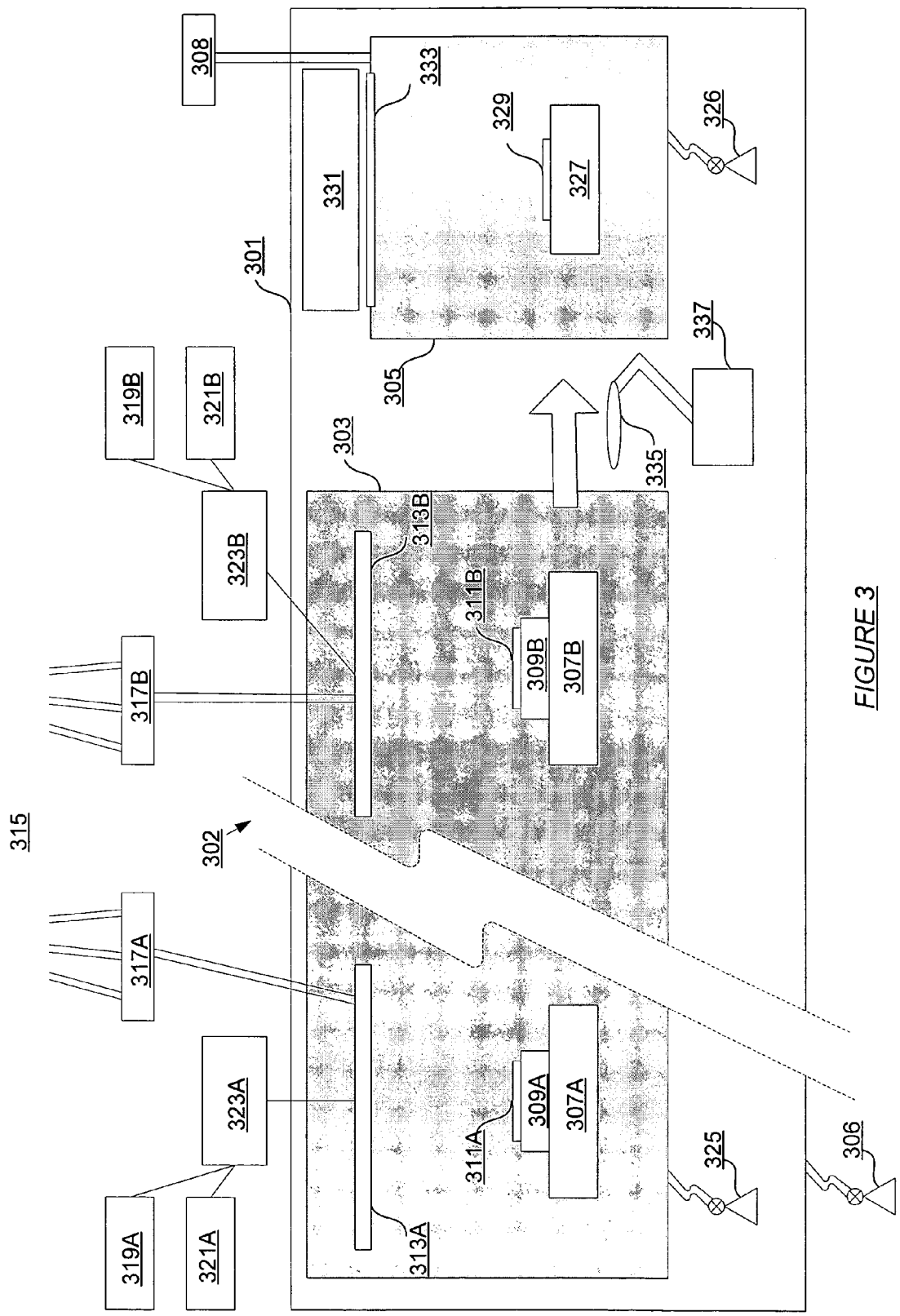
FIG. 3 is a schematic representation of an apparatus suitable for some embodiments of this invention.

FIG. 3 is a schematic diagram of one specific example multi-chambered apparatus that may be employed to implement the invention. An apparatus enclosure 301 houses two separate types of chambers, a PECVD chamber 303 and a UV irradiation chamber 305. A robot wafer handler 337 is positioned for transferring wafers (e.g., wafer 335) between chamber 303 and chamber 305. Apparatus enclosure 301, which encloses chambers 303 and 305 and robot wafer handler 337, can be entirely evacuated using vacuum pump system 306. This configuration is consistent with many cluster-type tools in the industry.

As shown in FIG. 3, the apparatus is capable of simultaneously processing multiple wafers in PECVD chamber 303. PECVD chamber 303 is capable of holding a vacuum and can be separately evacuated with vacuum pump system 325. As indicated by the slash-through mark, PECVD chamber 303 may comprise more than two stations for processing wafers. For simplicity, only two stations are shown. For example, one station comprises a station 307A with a pedestal 309A for holding a wafer 311A during exposure to plasma provided by showerhead a 313A. Similarly, a station 307B has a pedestal 309B for holding a wafer 311B during exposure to plasma provided by a showerhead 313B. Wafer station 307A and 307B may have heating elements (not shown) that can heat the wafer to defined temperatures and be controlled by a temperature controller. Showerheads 313A and 313B each deliver mixed process gases to their associated stations and also serve as capacitor plates for generating plasmas. A generic gas source 315 supplies three types of gases to the different stations of PECVD chamber 303 via manifolds 317A and 317B.

The power delivered for generating plasmas is provided via matching networks 323A and 323B, respectively. Matching network 323A matches high and low frequencies provided by a low frequency source 319A and a high frequency source 321A to produce optimal plasma generating and maintaining frequencies for showerhead 313A. Similarly, matching network 323B is supplied with a low frequency source 319B and a high frequency source 321B to produce optimal plasma generating and maintaining frequencies for showerhead 313B. In some embodiments, a single high frequency source, a single low frequency source and a single matching network supply power to all stations of chamber 303.

UV irradiation chamber 305 comprises a wafer holder 327, which secures wafer 329 in a position such that light from a UV light source 331 can irradiate wafer 329. Chamber 305 may be separately evacuated using vacuum system 326. Window 333 allows UV radiation from UV light source 331 to enter chamber 305. Note that window 333 may be composed of any suitable material for letting UV light pass, including quartz and sapphire. Filters can also be used to remove unwanted spectral components from particular sources to "tune" the sources for dielectric treatment. Wafer holder 327 may have a heating element (not shown) that can heat the wafer to defined temperatures and can be controlled by a temperature controller. If appropriate, UV irradiation chamber 305 is configured with a gas inlet connected to a gas source. The amount of gas introduced into UV irradiation chamber 305 can be controlled by a valve or other mechanism and measured by pressure gauge.

Note that UV light source 331 may be a single UV source or an array of UV sources, such as an array of UV lamps. In this example, UV light source 313 is mounted outside the chamber 305. In alternate embodiments, the UV light source array is housed inside chamber 305. The invention is not limited to any particular type of UV light source. Suitable UV sources include xenon, mercury, metal-doped mercury lamps, and deuterium lamps or lasers (e.g., excimer lasers and tunable variations of certain lasers). Various optical elements may be required to direct the UV light toward portions of the substrate. Methods for directing the light at different portions of the substrate at different times will be required as well. A scanning mechanism may be used for this purpose. Examples of other suitable UV chamber apparatus configurations are presented in U.S. patent application Ser. No. 10/800,377, which was previously incorporated by reference.

A typical process during normal operation of the apparatus in accordance with the invention will now be described. Note that the description is only one example of a typical operation and other operations with more, less, or different procedures may be implemented. First, wafers are transferred into apparatus enclosure 301 which is then evacuated using vacuum system 306. Next, the wafers are transferred into PECVD chamber 303 at a particular station and the chamber is closed. Then appropriate precursor gases are introduced to different stations within PECVD chamber 303 from gas source 315 via manifolds 317A and 317B. Power at the desired frequencies is supplied by matching networks 323A and 323B and is applied to the capacitive plates in showerheads 313A and 313B, respectively. Plasmas are then generated near wafers 311A and 311B and the precursor(s) are co-deposited to form precursor films on wafers 311A and 311B. After the precursor films are deposited, the flow of gases is stopped, the plasma sources are turned off, and PECVD chamber 303 is evacuated using vacuum system 325.

In embodiments employing porous dielectrics (as opposed to dense versions), a separate step of removing the porogen may be required. In such cases, a separate porogen removal treatment may be performed by thermal degradation, UV irradiation, etc. In a specific example, the porogen is removed by an in situ plasma treatment. For instance, hydrogen gas from gas source 315 is introduced into PECVD chamber 303 via manifolds 317A and 317B. Power at the correct frequencies is supplied by matching networks 323A and 323B and is applied to the capacitive plates in showerheads 323A and 323B, respectively. A plasma is then generated near wafers 311A and 311B and all or a substantial portion of the porogen is removed from wafers 311A and 311B. After the process is concluded, PECVD chamber 303 is then evacuated using vacuum pump system 325.

When processing in PECVD chamber 303 is concluded, it is opened and one of wafers 311A and 311B, e.g., wafer 311A, is removed from PECVD chamber 303 using robot wafer handler 337. The wafer is then placed onto wafer holder 329 in UV irradiation chamber 305, which is then closed and evacuated, if necessary, using vacuum pump system 326. Alternatively, an inert gas (e.g., argon, nitrogen) is introduced from gas source 308 to a certain chamber pressure. UV source 331 is then powered on and UV light shines through window 333 to expose wafer 311A on pedestal 327 to improve the toughness of the deposited film. After the film is sufficiently treated, UV source 331 is powered off and UV irradiation chamber 305 is further evacuated using vacuum pump system 326 to remove volatilized porogen residues.

UV irradiation chamber 305 is then isolated from vacuum by a valve in vacuum pump system 326 and opened to the vacuum conditions provided in apparatus enclosure 301. Wafer 311A is then removed from UV radiation chamber 305 using robot wafer handler 337 and wafer 311B is then placed in UV radiation chamber 305 for similar processing. Subsequent wafers are processed similarly in this sequence.

In alternative embodiments, UV irradiation chamber 305 is replaced with an e-beam irradiation chamber or a separate plasma treatment chamber—either of which may be employed for the purpose of curing the as deposited CDO film. Of course, if a plasma treatment is employed to improve toughness, it may be desirable to perform the treatment in the same chamber in which CDO film is deposited (e.g., chamber 303). Thus, for example, PECVD deposition could be performed initially in the chamber 303 and then plasma curing could be performed without removing the wafer. In some cases, the wafer could be placed in a first station of chamber 303 for purposes of CDO deposition and then moved to a different station of chamber 303 for curing.

In some cases, it will be desirable to deposit and cure the CDO film in multiple iterations. In this manner, the curing may be performed more completely, albeit gradually. By using a multi-station tool such as chamber 303, the process may treat the wafer in multiple iterations as described. At each station, a wafer receives a sub-layer of the CDO material and then is plasma treated to cure that sub-layer. The wafer may then be indexed to the next station where an additional sub-layer is deposited and cured with plasma. Eventually, the full thickness of precursor layer is deposited and plasma treated. At this point, the wafer is removed from chamber 303.

EXPERIMENTAL EXAMPLES

Example 1

A CDO film is prepared using a TMCTS+CO2 process. The film produced has a k value at 2.70. The film is then subjected to an UV light treatment.

Figure 4A:
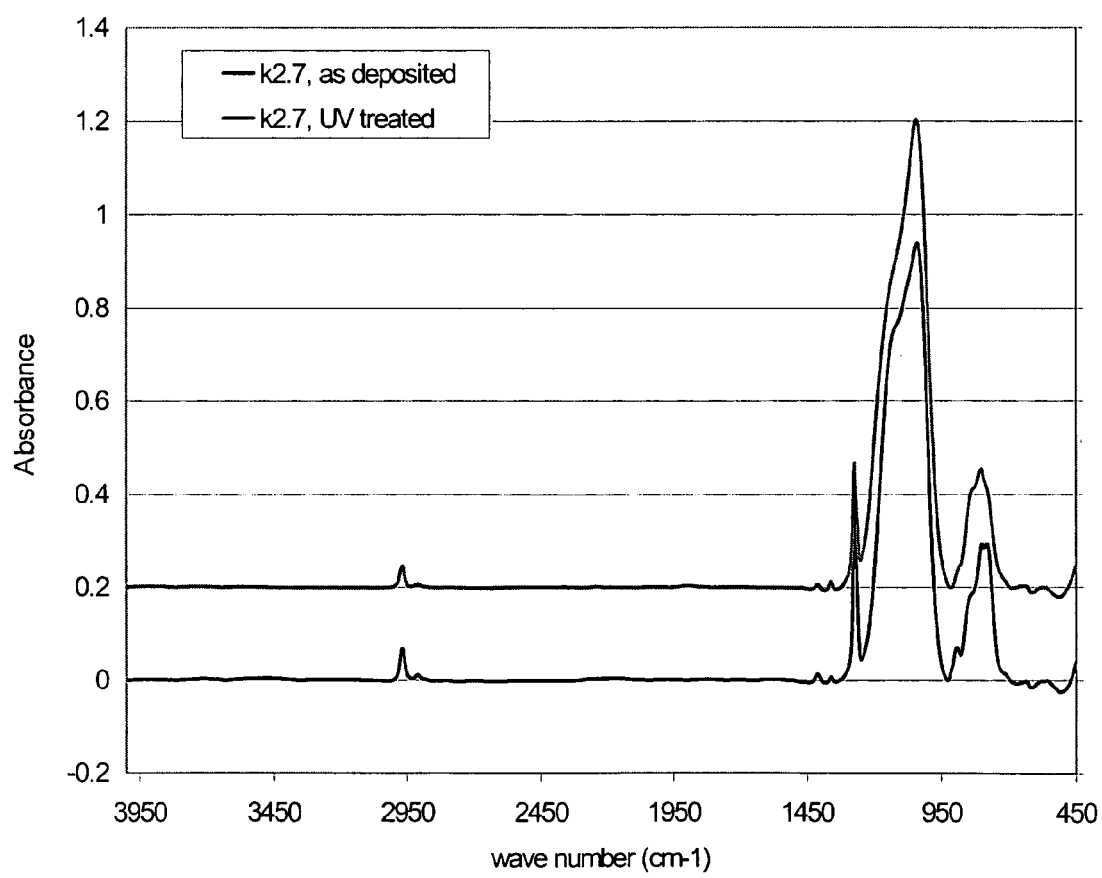
FIGS. 4a and 4b are graphs showing FTIR spectra of precursor films before and after a curing process.
Figure 4B:
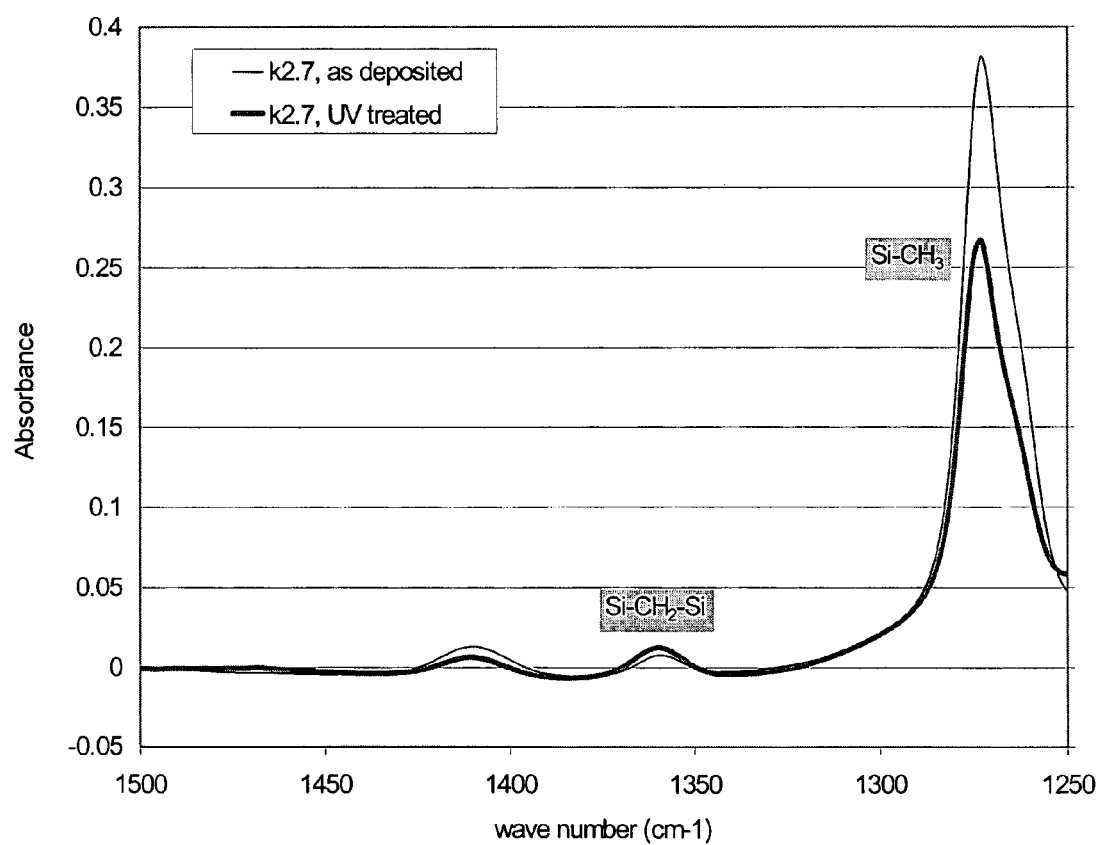

FIGS. 4a and 4b show FTIR spectra of k2.7 film before and after UV treatment. FIG. 4a shows the spectra from 450 $cm^{-1}$ to 4000 $cm^{-1}$, detailing all the main peaks for a typical CDO film. FIG. 5b shows detailed peak variations for the Si—$CH_3$ peak and the Si—$CH_2$—Si peak.

After UV the treatment, the FTIR spectrum indicates a significant change in the Si—O peak at 1000 to 1150 $cm^{-1}$. Also, significantly, the Si—CH3 peak has decreased and Si—$CH_2$—Si has increased as a result of the UV treatment, which indicates that the UV treatment has induced some Si—$CH_3$ bond dissociation and crosslinking.

The film bond structure change is also indicated by a change in refractive index (RI) at 633 nm (not shown). This is because increased crosslinking densifies the film and an increased in Si—C bond concentration increases the RI. For the above mentioned film with k=2.7, the RI is 1.382 as deposited and 1.401 after UV treatment.

Figure 5:
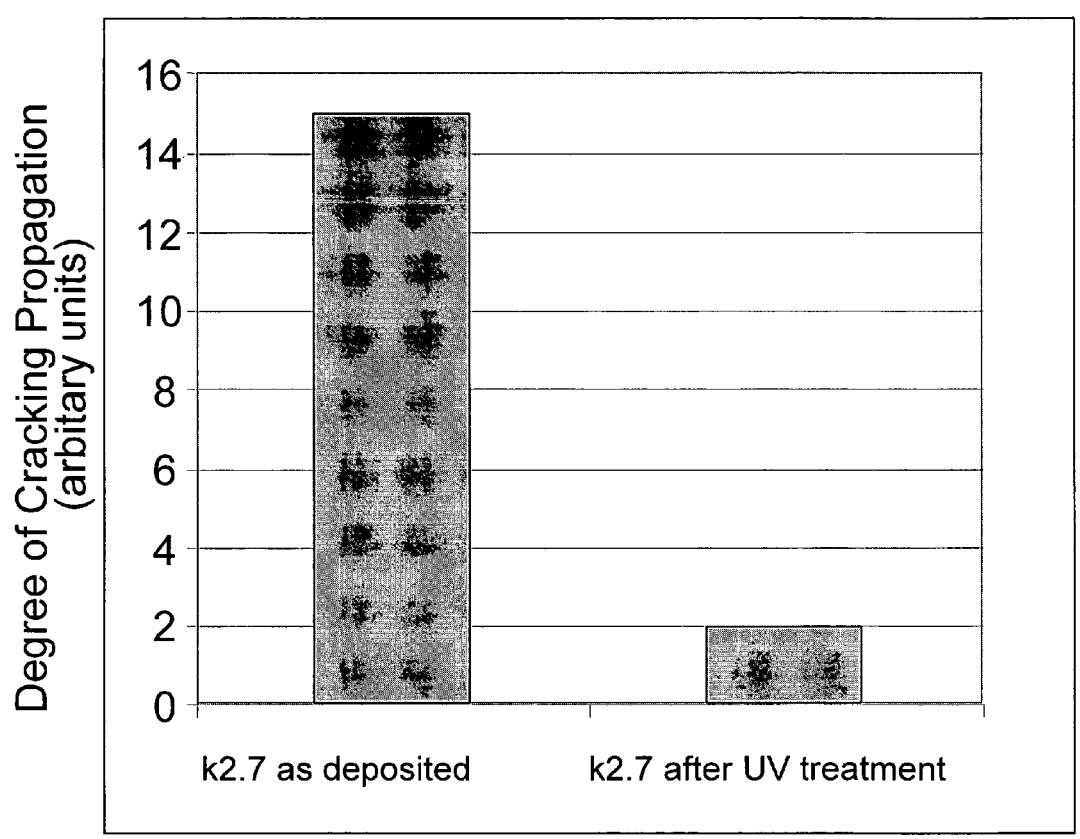
FIG. 5 is a graph comparing the degree of cracking propagation and branching for a film with and without UV treatments.

The cracking of the film with k=2.7 was then investigated using water a submersion method to accelerate cracking propagation and branching. FIG. 5 is a graph comparing the degree of cracking propagation and branching for a film with and without UV treatments. The results indicate that there was a significant improvement (about a seven-fold increase) in the film's cracking resistance using UV treatment.

What is claimed is:

1. A method for improving the mechanical properties of a CDO dielectric film comprising:
    providing either a dense CDO dielectric film or a porous CDO film in which the porogen has been removed, and wherein the dense or porous CDO film was produced from at least a precursor having a carbon—carbon triple bond; and
    curing the CDO dielectric film using a UV light treatment whereby the curing improves the mechanical toughness of the CDO dielectric film; wherein the wavelength of the UV light is between about 200–400 nm.

2. The method of claim 1, further comprising exposing the CDO film to a reactive gas selected from the list comprising hydrogen ($H_2$), acetylene ($C_2H_2$), oxygen ($O_2$), and carbon dioxide ($CO_2$).

3. The method of claim 1, wherein the deposition chamber is maintained at a pressure of between about 0.1 and 760 Torr during the UV light treatment.

4. The method of claim 1, wherein the intensity of the UV light is between about 200 $mW/cm^2$ and 1 $W/cm^2$.

5. The method of claim 1, wherein the intensity of the UV light is between about 100 $mW/cm^2$ and 5 $W/cm^2$.

6. The method of claim 1, wherein the wavelength of the UV light is between about 250–350 nm.

7. The method of claim 1, wherein the duration of the UV light treatment is between about 1–8 minutes.

8. The method of claim 1, wherein the duration of the UV light treatment is between about 10 seconds and ½ hour.

9. The method of claim 1, wherein the substrate is maintained at a temperature of between about 150–400° C. during the UV light treatment.

10. The method of claim 1, wherein the substrate is maintained at a temperature of between about 20–400° C. during the UV light treatment.

11. The method of claim 1, wherein the CDO film produced has a dielectric constant between about 2.0–3.5.

12. The method of claim 1, wherein the CDO film is a dense CDO film.

* * * * *